US012645028B2

(12) United States Patent
Chen et al.

(10) Patent No.: US 12,645,028 B2
(45) Date of Patent: Jun. 2, 2026

(54) WAVEGUIDE INTEGRATED PHOTODIODE

(71) Applicant: Cisco Technology, Inc., San Jose, CA (US)

(72) Inventors: Long Chen, Marlboro, NJ (US); Gianlorenzo Masini, Carlsbad, CA (US)

(73) Assignee: Cisco Technology, Inc., San Jose, CA (US)

( * ) Notice: Subject to any disclaimer, the term of this patent is extended or adjusted under 35 U.S.C. 154(b) by 403 days.

(21) Appl. No.: 18/140,826

(22) Filed: Apr. 28, 2023

(65) Prior Publication Data

US 2024/0361523 A1 Oct. 31, 2024

(51) Int. Cl.
| | |
|---|---|
| *G02B 6/122* | (2006.01) |
| *G02B 6/12* | (2006.01) |
| *H10F 30/223* | (2025.01) |
| *H10F 71/00* | (2025.01) |

(52) U.S. Cl.
CPC ........... *G02B 6/122* (2013.01); *H10F 30/223* (2025.01); *H10F 71/121* (2025.01); *G02B 2006/12061* (2013.01); *G02B 2006/12123* (2013.01)

(58) Field of Classification Search
CPC ... G02B 6/122; G02B 6/12004; H10F 30/223; H10F 77/206; H10F 77/147; H10F 71/121
See application file for complete search history.

(56) References Cited

U.S. PATENT DOCUMENTS

| | | |
|---|---|---|
| 10,955,692 B2 | 3/2021 | Yu et al. |
| 2009/0078963 A1 | 3/2009 | Khodja |
| 2012/0288971 A1* | 11/2012 | Bogaerts ............ G02B 6/12004 438/57 |
| 2022/0065692 A1 | 3/2022 | Baudot |

FOREIGN PATENT DOCUMENTS

| | | |
|---|---|---|
| CN | 109119500 | 1/2019 |
| EP | 2523026 A1 | 11/2012 |

OTHER PUBLICATIONS

Mastronardi et al., "56 Gbps Si/GeSi integrated EAM", Proceedings of SPIE, vol. 10823, Oct. 25, 2018, pp. 108230D-1-108230D-10.
Extended European Search Report for Application No./Patent No. 24172816.1-1002 mailed Oct. 1, 2024 (10 pages).

* cited by examiner

*Primary Examiner* — Michael P Mooney
(74) *Attorney, Agent, or Firm* — Patterson + Sheridan, LLP

(57) ABSTRACT

In part, in one aspect, the disclosure relates to a photodiode. The photodiode may include a substrate; a semiconductor layer comprising an semiconductor material, the semiconductor layer disposed on the substrate and in communication with at least a region of the substrate, the semiconductor layer having a first side, a second side, and an upper surface, the semiconductor layer having a height; a semiconductor structure partially disposed on the upper surface, the semiconductor structure comprising at least one elongate portion that extends beyond the first side and along a portion of the upper surface of the semiconductor layer; and a metal contact that is in electrical connection with the elongate portion of the semiconductor structure.

27 Claims, 7 Drawing Sheets

100

108

100

108

106b    110    106a    106c

N++    N+ silicon

102

112    115

P++ silicon    P+ silicon    P++ silicon 104

100

108

106b    110    106a    106c

N++    N+ silicon

102

105    115    105

P++ silicon    P+ silicon    P++ silicon 104

100

108

106b    110    106a    106c

N++    N+ silicon 118a    102    115    118b 105    105

P++ silicon    P+ silicon    P++ silicon 104

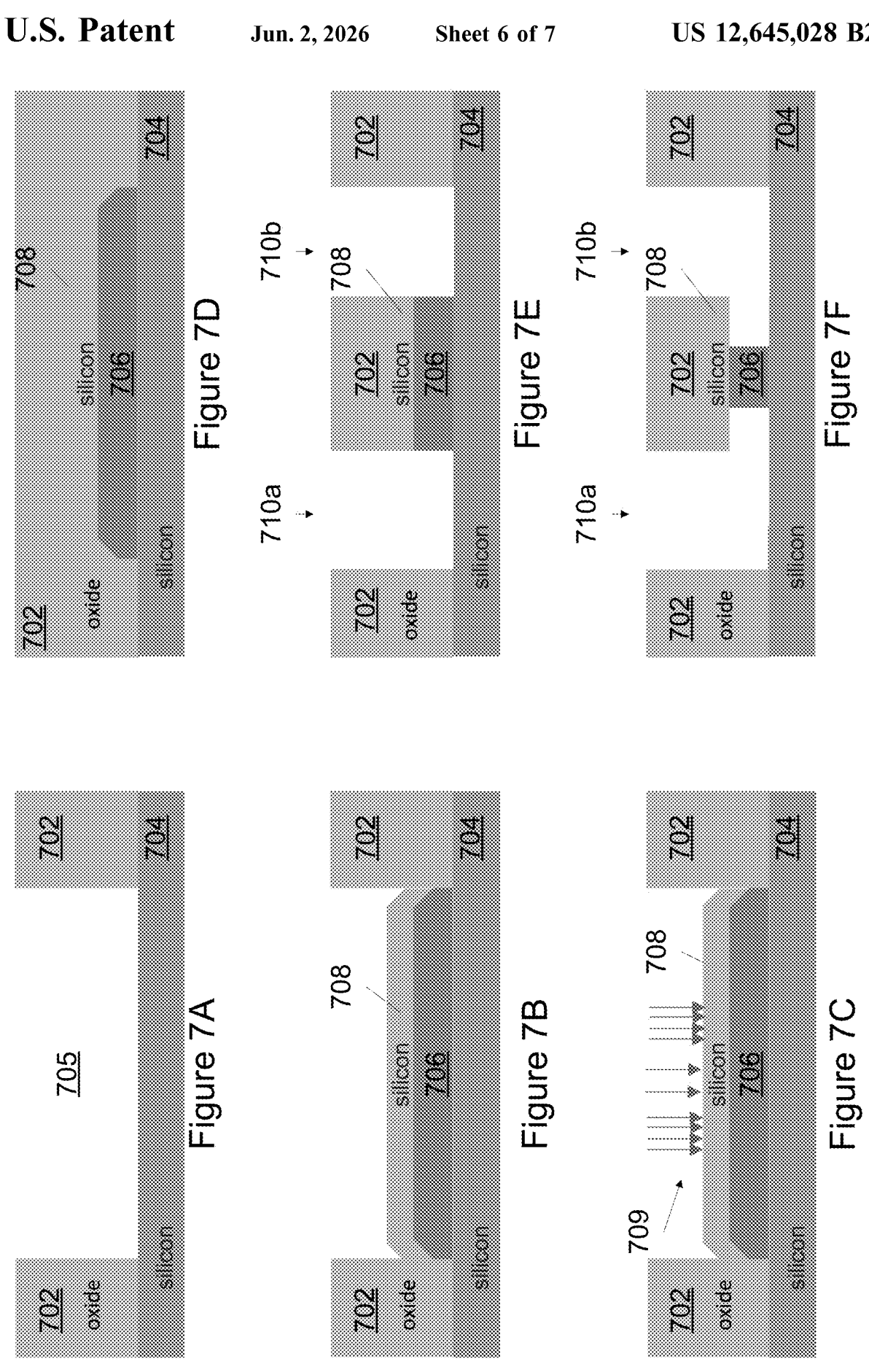

WAVEGUIDE INTEGRATED PHOTODIODE

FIELD

This disclosure relates generally to the field of integrated photonic systems.

BACKGROUND

Contemporary optical communications and other photonic systems make extensive use of photonic integrated circuits that are advantageously mass-produced in various configurations for various purposes.

SUMMARY

In part, in one aspect, the disclosure relates to various photodiodes and methods of fabrication that increase optical bandwidth without degrading responsivity of the photodiode. In another aspect, in part, the disclosure relates to a photodiode. The photodiode may include a substrate; a semiconductor layer comprising an semiconductor material, the semiconductor layer disposed on the substrate and in communication, such as optical or electrical communication, with at least a region of the substrate, the semiconductor layer having a first side, a second side, and an upper surface, the semiconductor layer having height $H_i$; a semiconductor structure partially disposed on the upper surface, the semiconductor structure comprising at least one elongate portion that extends beyond the first side and along a portion of the upper surface of the semiconductor layer; and a metal contact that is in electrical connection with the elongate portion of the semiconductor structure.

In some embodiments, a portion of the substrate is an optical waveguide and wherein a portion of the semiconductor material is in optical communication with a region of the optical waveguide. In various embodiments, the at least one elongate portion extends beyond the first side, along the upper surface, and beyond the second side of the semiconductor layer. In some embodiments, the elongate portion is doped with N+ dopants.

In some embodiments, the elongate portion is doped with N+ dopant such that the concentration of N+ dopants is greater at a first end and a second end of the elongate structure relative to a middle portion of the elongate structure. In various embodiments, the photodiode may further include a plurality of electrical contacts, wherein one of the plurality of electrical contacts extends from the substrate and wherein another of the plurality of electrical contacts extends from the at least on elongate portion.

In some embodiments, at least one elongate portion comprises a first wing that extends past the first side. In various embodiments, the at least one elongate portion comprises a second wing that extends past the second side. In some embodiments, the semiconductor material is selected from the group consisting of germanium, silicon, tin, indium, gallium, phosphorous, arsenic and their alloys.

In various embodiments, $H_i$ is greater than about 200 nm and less than about 900 nm. In various embodiments, the photodiode may further include an insulator layer, wherein the insulator layer defines a trench, wherein the semiconductor material is disposed in the trench. In some embodiments, the substrate comprises silicon, wherein the silicon is p-type doped. In various embodiments, a length of the first wing ranges from about 200 nm to about 1000 nm. In some embodiments, the semiconductor structure and the substrate are doped such the charge carrier properties of the semiconductor structure is opposite of the charge carrier properties of the silicon substrate.

In various embodiments, the semiconductor structure further comprises a central portion having a top surface, wherein a top surface of the elongate portion is higher than the top surface of the central portion. In some embodiments, the distance from a top surface of the substrate and a top surface of the elongate portion of the semiconductor structure is greater than about 450 nm but less than about 800 nm. In many embodiments, semiconductor layer partially resides inside the substrate in a recessed cavity.

In yet another aspect, in part, the disclosure relates to a photodiode. The photodiode may include a substrate; a semiconductor layer disposed on the substrate, wherein a portion of the semiconductor layer is in communication, such as optical or electrical communication, with at least a region of the substrate, the semiconductor layer having a first side, a second side, and an upper surface; and a semiconductor structure partially disposed on the upper surface of the semiconductor layer, the semiconductor structure may include a first elongate portion that extends beyond the first side of the semiconductor layer and a second elongate portion that extends beyond the second side of the semiconductor layer; and at least one metal contact that is in electrical connection with at least one of the elongate portion of the semiconductor structure.

In many embodiments, photodiode may further include a pair of insulator structures that define a stepped trench, wherein the semiconductor layer is disposed in a bottom of the stepped trench. In some embodiments, the distance from a top surface of the substrate and a top surface of the elongate portions of the semiconductor structure is greater than about 450 nm but less than about 800 nm.

In still in yet another aspect, in part, the disclosure relates to a method of manufacturing an integrated photodiode. The method may include providing a silicon substrate with an oxide layer; growing a semiconductor layer on an exposed portion of the silicon substrate, the semiconductor layer comprising a first side, an upper surface, and a second side; forming a semiconductor structure on the upper surface of the semiconductor layer wherein the semiconductor structure has at least one elongate portion that extends beyond the first side of the semiconductor layer; and bonding a metal contact onto the elongate portion of the semiconductor structure.

In various embodiments, the method may further include etching excess portions of the semiconductor structure. In various embodiments, the method may further include doping the semiconductor structure. In some embodiments, the semiconductor structure is doped such that the portion of the semiconductor structure bonded to the upper surface of the semiconductor layer is less doped relative to the at least one doped portion. In various embodiments, the method may further include shortening a portion of the at least one elongate portion of the semiconductor structure. In some embodiments, the trench is T-shaped having a base opening of about 0.5 μm and a top opening of about 3 μm. In various embodiments, the method may further include removing a portion of an oxide layer to leave an exposed portion of the silicon substrate and defining a trench relative thereto.

Although, the disclosure relates to different aspects and embodiments, it is understood that the different aspects and embodiments disclosed herein can be integrated, combined, or used together as a combination system, or in part, as separate components, devices, and systems, as appropriate. Thus, each embodiment disclosed herein can be incorporated in each of the aspects to varying degrees as appropriate for a given implementation. Further, the various apparatus, optical elements, doped semiconductor structures, elongate semiconductors structures such as wings or caps, passivation coatings/layers, optical paths, waveguides, splitters, couplers, combiners, electro-optical devices, inputs, outputs, ports, channels, components and parts of the foregoing disclosed herein can be used with any laser, laser-based communication system, fiber, transmitter, transceiver, receiver, and other devices and systems without limitation.

These and other features of the applicant's teachings are set forth herein.

BRIEF DESCRIPTION OF THE FIGURES

Unless specified otherwise, the accompanying drawings illustrate aspects of the innovations described herein. Referring to the drawings, wherein like numerals refer to like parts throughout the several views and this specification, several embodiments of presently disclosed principles are illustrated by way of example, and not by way of limitation. The drawings are not intended to be to scale. A more complete understanding of the disclosure may be realized by reference to the accompanying drawings in which:

FIGS. 7A-7H depict an alternative method of fabricating various photodiode designs incorporating wings or elongate structures according to an exemplary embodiment of the disclosure.

DETAILED DESCRIPTION

Figures 1A, 1B, 1C:
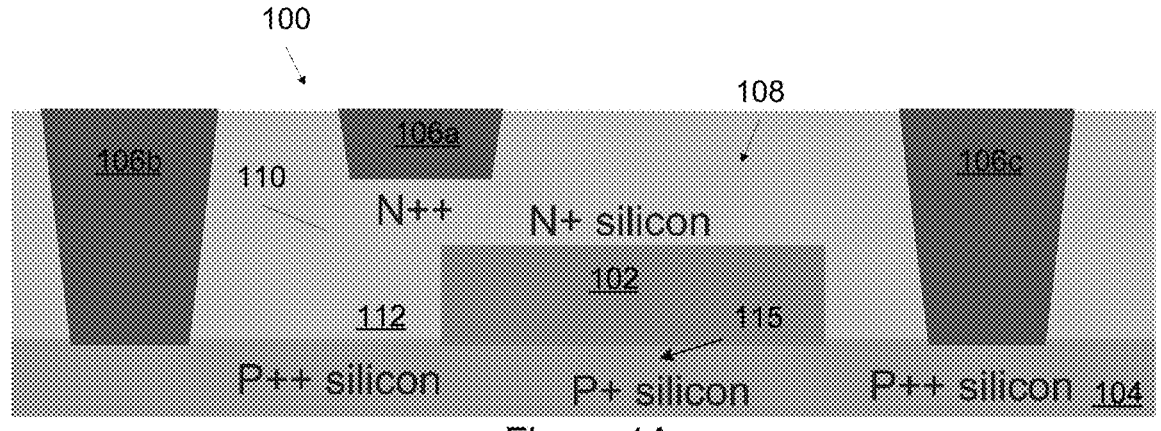
FIG. 1A is a schematic diagram showing a cross-sectional view of a photodiode that includes a wing structure that extends in one direction according to an exemplary embodiment of the disclosure.
FIGS. 1B and 1C are schematic diagram showing a cross-sectional view of a photodiode that includes a wing structure that extends in one direction and wherein one or more partially etched are formed in the substrate according to an exemplary embodiment of the disclosure.

The present disclosure relates to the design, creation, and/or implementation of waveguide integrated photodiodes. In various embodiments, the photodiode design is that of a P-I-N or PIN photodiode that is fabricated using various layers or regions. In many embodiments, the PIN photodiode includes a semiconductor material (I), that is sandwiched between a p-type semiconductor (P) and an n-type semiconductor region (N) to result in the PIN structure, which may vertically or horizontally oriented in different designs. In various embodiments, the semiconductor material (I) may be a doped semiconductor material that is an extrinsic semiconductor material or a doped semiconductor material. In many embodiments, the semiconductor material (I) is an intrinsic semiconductor material such as germanium although others may be used. Accordingly, any references or depictions showing the use of germanium as semiconductor material (I) may use other suitable semiconductor materials, such as silicon, Silicon Germanium, Silicon Germanium Tin, or gallium arsenide or indium phosphide or indium gallium arsenide or indium gallium arsenide phosphide. In various embodiments, the intrinsic semiconductor material (I) is undoped, or non-intentionally doped, or very lightly doped.

Photodiodes may exhibit difficulty in achieving both high responsivity (or quantum efficiency) and high bandwidth. A photodiode may have different regions that absorb the optical signals, not all of which are desirable. In some embodiment, photodiodes rely on inter-band absorption of semiconductor materials (I), such as germanium, to convert the absorbed light into electron and hole carriers which can be collected to form photocurrent. Such process can have high quantum efficiency close to unity. To collect such photocurrent, a photodiode may use conductive electrodes that may consist of metals such as tungsten, titanium, aluminum, copper, and highly doped semiconductors. In some embodiment, the conductive electrodes are placed on two sides of the semiconductor material (I). In some embodiment, the photodiode can use metal electrodes in direct contact with the semiconductor absorbing material (I), forming a metal-semiconductor-metal configuration. In some embodiment, additional doped semiconductors are present between the metal electrodes and the semiconductor absorbing material (I). Such doped semiconductors are often doped with opposite type, one p-type (P) and the other n-type (N), forming a P-I-N configuration. Note in some embodiment, that the doped semiconductors (P or N) as part of the electrodes can be of the same material as the absorbing semiconductor material (I). In some embodiment, the doped semiconductor (P or N) can be of a different material than the absorbing semiconductor material (I). For example, the absorbing semiconductor material (I) can be germanium, and the doped semiconductor (P or N) can be silicon. Such configuration can be beneficial in responsivity and bandwidth. In many cases, such conductive electrodes of metal and doped semiconductor regions can absorb light but do not generate the desired photocurrent, or with very limited efficiency. As a result, the quantum efficiency of the photodiodes degrades. This is particularly true for high bandwidth photodiodes, where the semiconductor material (I) often needs to be thin and the conductive electrodes need to be placed very close to the optical signal to sweep the carriers out of the semiconductor material (I) very quickly. As a result, optical absorption in the semiconductor material (I) competes with optical absorption of the conductive electrodes, primarily metal electrodes, and doped semiconductor to a less extent. As one would expect, such competition strongly depends on the photodiode geometry and the absorption coefficient of the semiconductor material (I) and that of the conductive electrodes. For example, for optical signal of 1550 nm wavelength, the absorption coefficient of germanium is approximately $1000 \text{ cm}^{-1}$ and drops quickly at longer wavelengths, while the absorption coefficient of metal electrodes can be more than 10 times higher. Having metal electrodes in close proximity to the optical signal can therefore severely degrade the quantum efficiency or responsivity of high bandwidth photodiodes.

For example, in an embodiment where the semiconductor material (I) is made of germanium and metal electrodes are placed on the two sides of the germanium film, when the germanium thickness changes from 750 nm to 250 nm, the carrier transit limited bandwidth, which is determined by the inverse of the time required to sweep the carriers across the thickness of the germanium film, can increase approximately from about 40 GHz to about 120 GHz. At the same time, as the germanium thickness reduces to only ⅓, the optical signal has much less interaction with germanium and much more interaction with the conductive electrodes. As a result, the responsivity of germanium photodiode at wavelengths of about 1550 nm may decrease by as much as 3 dB. At longer wavelengths such as the edge of C-band or L-band, the degradation could be even worse.

The present disclosure provides a modified structure to allow for high responsivity with thin regions of absorbing semiconductor material, such as, for example, in a germanium photodiode. By introducing an elongate portion of doped and conductive semiconductor material in the diode, the distance between the absorbing semiconductor region (I) and the metal contacts can be increased. Increasing the distances decreases the absorption competition between the metal contacts and the absorbing semiconductor material (I). Therefore, a thinner region of absorbing semiconductor material (I) can be utilized for adequate carrier transit without sacrificing responsivity. In various embodiments, the use of an elongate region such as wing or cap that extends on one or both sides past the side surfaces of the absorbing semiconductor material (I) of the diode allows the metal contacts to be offset or shifted away from the absorbing semiconductor material (I) of the diode.

Refer now to the example embodiment of FIG. 1A. FIG. 1A shows a cross-sectional view of waveguide integrated photodiode 100 that includes a wing or elongate structure that extends beyond the width of a region of semiconductor material 102 on at least one side. The waveguide integrated photodiode 100 includes a region of semiconductor material 102, such as, for example, germanium, that is disposed on a substrate 104 such as silicon or other semiconductor materials. Various metal or electrically conductive contacts 106a, 106b, and 106c are shown that may serve to deliver or transmit electrical signals, such as voltage or current based signals. In some designs, electrical contact 106a may be directly placed in contact and substantially in the middle of the semiconductor region 102, which may a doped semiconductor or intrinsic semiconductor or other material disclosed herein.

In various embodiments, the different layers, regions, portions and other components of a given photodiode may be doped to have different concentrations and types of charge carriers such as holes and electrons. For example, in various embodiments, one or more regions, layers, volumes, or other structures that include a semiconductor material may be selectively doped to have an increased distribution of electrons (N+), an increased distribution of holes (P+) or combinations thereof. In still other embodiments, the distribution of charge carriers may be further increased relative to other doped regions. As a result, for example a P++ doped material has more holes relative to a P+ doped material. Similarly, a N++ doped material has more electrons relative to a N+ doped material. Various exemplary regions/volumes of material that are P+ doped, N+ doped, P++ doped, and N++ doped are shown as examples in the various figures. In many embodiments, the various doping types and levels may be changed, modified, or not be used. In addition, in various embodiments, including those depicted in the drawings the polarity of the various doped regions may be reversed along a given conductive path. For example, in FIG. 1, the bottom silicon portion is of P+ and P++ type, and the top silicon region 108 is of N+ type. The polarity can be switched between the bottom and top regions.

Applicant has discovered that the operation of the photodiode may be improved by positioning the metal contact 106a such that it is not in contact with the semiconductor region 102 and no longer disposed above the middle of the semiconductor region 102, to avoid the excessive optical absorption of the metal contact 106a that degrades the responsivity. This may be accomplished by using a semiconductor material that has a wing or elongate structure that allows electrical contact 106a to be shifted up and away from region 102 while still being in electrical communication therewith. On top of the semiconductor region 102 is a doped semiconductor region 108 that is electrically connected to a metal contact 106a though the wing structure 110. The semiconductor region 108 preferably has a larger bandgap than the semiconductor region 102, and is not strongly absorbing to the optical signal when undoped. For example, for telecommunication wavelengths around 1300 nm and 1550 nm, the semiconductor region 102 can be made of germanium, and the semiconductor regions 104 and 108 can be made of silicon. In various embodiments, structures or regions 108 and 110 may be an elongate structure such as wing or a portion thereof. For example, structure 110 may be the portion of overall structure 108 that extends beyond semiconductor region 102 in some embodiments.

In various embodiments, the substrate 104 includes one or more sections or regions that include an optical waveguide. In some embodiments, the optical waveguide may be located near the semiconductor region 102 such as within waveguide region 115. In many embodiments, an optical signal may be carried by a waveguide formed in the bottom substrate 104 such as in region 115 and/or in other portions of the substrate 104. Refer now to the example embodiment of FIG. 1B which shows an example where the waveguide region 115 is partially etched beyond the edges of the semiconductor region 102 to define etched regions 105. In some embodiments, etched regions 105 may define trenches or cavities on either side of waveguide region 115. The partial etching defines a waveguide which can be connected to various launch waveguides in order to couple light into the photodiode. In some embodiment, the width of the etched trenches 105 can range between about 0.2 um to about 1.0 um. In some embodiment, the depth of trenches 105 can range between about 25% and about 75% of the full thickness of the silicon.

In various embodiments, the semiconductor region 102 can sit on top of the semiconductor region 115. Refer now to the example embodiment of FIG. 1C where the semiconductor region 102 partially resides inside the waveguide region 115 through a recessed cavity that is between regions 118a, 118b of substrate 104. In turn, in some embodiments, a portion of regions 118a, 118b, may partially define etched regions 105. The depth of recess can vary from about 0 nm to more than about half of the thickness of the substrate 104. For example, the substrate 104 can be about 220 nm thick, and the depth of recess can be approximately 40 nm, or approximately 100 nm, or approximately 160 nm.

In various embodiments, the elongate semiconductor region or wing 108 is a silicon region. In various embodiments, additional metal contacts 106b, 106c are connected to or in electrical communication with the silicon substrate 104. The wing structure 110 extends beyond the semiconductor region 102 to minimize the impact the metal contact 106a has on the optical absorption of the semiconductor region 102. A metal contact 106a connects to the wing structure 110 and does not have significant overlap with the semiconductor region 102 or impact on the optical mode of the waveguide integrated photodiode 100. This modified structure reduces the amount of optical absorption due to the metal contacts and thus improves responsivity. In various embodiments, the wing structure 110 placement may be positioned to reduce parasitic resistance and capacitance.

In various embodiments, the doped semiconductor region 108 is doped n-type (marked N+). In various embodiments, the doped semiconductor region 108 is more heavily n-type doped (marked N++) on the wing structure 110. In various embodiments, it is desirable to reduce the doping of the doped semiconductor region 108 from the wing structure 110 to the portion of the doped semiconductor region 108 in close proximity of the semiconductor region 102 so that the doping induced optical absorption does not compete with the absorption of the semiconductor region 102. In various embodiments, the substrate 104 is doped p-type. In various embodiments, the silicon substrate 104 is least doped in the region under the semiconductor region 102 and more heavily doped in the regions connected to the metal contacts 106b, 106c.

In some embodiments, the polarity of the silicon substrate 104 is the opposite such that the doped semiconductor region 108 is p-type doped and the substrate 104 is n-type doped. In various embodiments, the most doped regions may range from a dopant concentration of about $1\times10^{20}$ atoms/cm$^3$ to about $1\times10^{21}$ atoms/cm$^3$. In various embodiments, the least doped regions may range from a dopant concentration of about $1\times10^{18}$ atoms/cm$^3$ to about $2\times10^{19}$ atoms/cm$^3$. In some embodiments, the region marked with a certain doping type can contain strong gradient in the dopant concentration. For example, the semiconductor region 108 can have a vertical gradient, that is, near its bottom interface in contact with semiconductor region 102 the dopant concentration is lower, for example, around $2\times10^{18}$ atoms/cm$^3$, and near its top interface the dopant concentration is higher, for example, around $2\times10^{19}$ atoms/cm$^3$. In various embodiments, the waveguide integrated photodiode 100 includes an insulator or passivation layer 112 and may comprise an oxide or other suitable materials.

Figures 2, 3, 4:
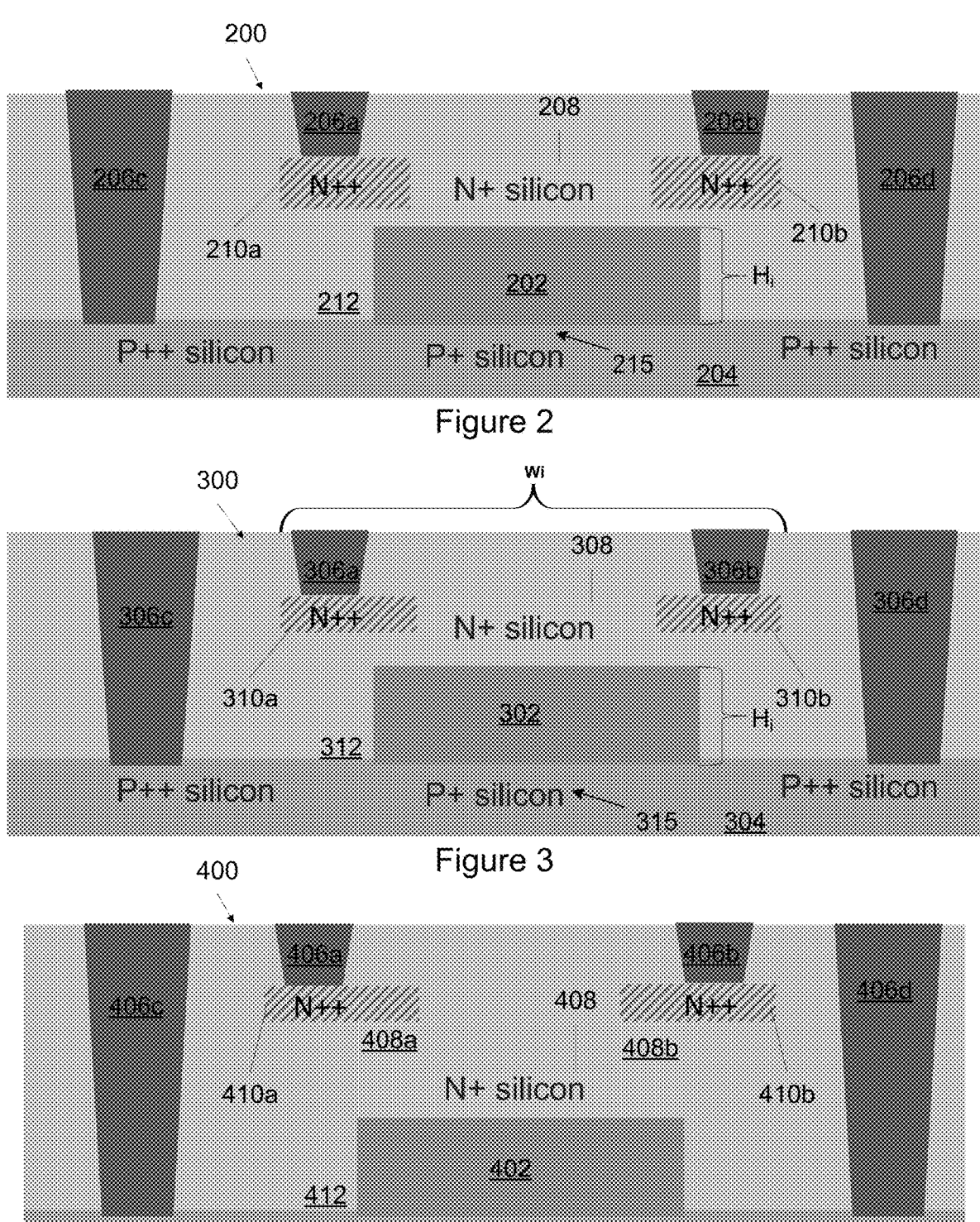
FIG. 2 is a schematic diagram showing a cross-sectional view of a photodiode that includes a wing structure that extends in two directions according to an exemplary embodiment of the disclosure.
FIG. 3 is a schematic diagram showing a cross-sectional view of a photodiode that includes a modified wing structure that extends in two directions according to an exemplary embodiment of the disclosure.
FIG. 4 is a schematic diagram showing a cross-sectional view of a photodiode that includes a modified wing structure with an increased vertical offset according to an exemplary embodiment of the disclosure.

Refer now to the example embodiment of FIG. 2. FIG. 2 shows a cross-sectional view of waveguide integrated photodiode 200 that includes a wing or elongate structure that extends beyond the width of the semiconductor region 202 on two or more sides. In various embodiments, the semiconductor region 202 includes an intrinsic semiconductor material such as germanium, a doped semiconductor, or other material as disclosed herein. The waveguide integrated photodiode 200 includes a semiconductor region 202 on a silicon substrate 204. On top of the semiconductor region 202 is a doped semiconductor region 208 that is connected or coupled to metal contacts 206a, 206b through two wing structures 210a, 210b. In various embodiments, the metal contacts 206c, 206d are coupled to or in electrical communication with the silicon substrate 204. Both wing structures 210a, 210b extend beyond the semiconductor region 202. In various embodiments, utilizing the waveguide integrated photodiode 200 of FIG. 2 reduces the parasitic resistance of the system more than the waveguide integrated photodiode 100 of FIG. 1.

In various embodiments, the doped semiconductor region 208 is n-type doped. In various embodiments, the doped semiconductor region 208 is more heavily doped on the wing structures 210a, 210b. In some embodiments, like the drawing in FIG. 1B, the optical waveguide may be located near the semiconductor region 202 such as within waveguide region 215. In many embodiments, an optical signal may be carried by a waveguide formed in the bottom substrate 204 such as in region 215 and/or in other portions of the substrate 204. In some embodiments, the semiconductor region 202 may sit in a recessed cavity in semiconductor region 204 having a similar structure as the recessed region between substrate portions 118a and 118b as depicted in FIG. 1C.

In various embodiments, it is desirable to reduce the doping of the doped semiconductor region 208 from the wing structures 210a, 210b to the portion of the doped semiconductor region 208 in close proximity of the semiconductor region 202 so that the doping does not compete with the semiconductor region 202. In various embodiments, the silicon substrate 204 is p-type doped. In various embodiments, the silicon substrate 204 is least heavily doped in the region under the semiconductor region 202 and most heavily doped in the regions connected to the metal contacts 206c, 206d. In various embodiments, the polarity of the doped semiconductor region 208 and the silicon substrate 204 is the opposite such that the doped semiconductor region 208 is p-type doped and the silicon substrate 104 is n-type doped. In various embodiments, the most doped regions may range from about $1\times10^{20}$ atoms/cm$^3$ to about $1\times10^{21}$ atoms/cm$^3$. In various embodiments, the least doped regions may range from about $1\times10^{18}$ atoms/cm$^3$ to about $2\times10^{19}$ atoms/cm$^3$. In various embodiments, the doped region can also have vertical gradient in the dopant concentration as referenced with regard to FIG. 1A-C. In various embodiments, the waveguide integrated photodiode 200 includes an oxide layer 212.

Refer now to the example embodiment of FIG. 3. FIG. 3 depicts an alternative waveguide integrated photodiode 300 that includes a wing or elongate structure 308 that is disposed on a semiconductor region 302. In various embodiments, the semiconductor region 302 includes an intrinsic semiconductor material such as germanium, a doped semiconductor, or other material as disclosed herein. The waveguide integrated photodiode 300 includes a semiconductor region 302 on a substrate 304, with a doped semiconductor region 308 on top of the semiconductor region 302 that is connected or in communication with metal contacts 306a, 306b or other conductive structures through two elongate structures 310a, 310b of semiconductor region/component 308 such as for example, silicon wings or a cap that extends in one or more directions above region 302. In some embodiments, the optical waveguide may be located near the semiconductor region 302 such as within waveguide region 315. In many embodiments, an optical signal may be carried by a waveguide formed in the bottom substrate 304 such as in region 315 and/or in other portions of the substrate 304.

In various embodiments, additional metal contacts 306c, 306d are in electrical communication with the substrate 304. In various embodiments, the wing structures 310a, 310b are thinner than the rest of the silicon region 308. In various embodiments, the wing structures 310a, 310b are half as thick as the rest of the doped semiconductor region 308. In various embodiments, the wing structures 310a, 310b are doped with a N+ dopant. In various embodiments, the doped semiconductor region 308 is doped with an increased concentration of N+ dopants on the elongate wing or cap structures 310a, 310b. In various embodiments, the waveguide integrated photodiode 300 includes an oxide layer 312. In many embodiments, the elongate structures/wing structures 310*a*, 310*b* and other similar structures disclosed herein are thin films. In various embodiments, the width of the elongate structures (such as wings or caps) ranges from about 200 nm to about 1000 nm.

Refer now to the example embodiment of FIG. 4. FIG. 4 depicts an alternative waveguide integrated photodiode 400 that includes a doped semiconductor region 408 having a wing or elongate structure that provides an increased vertical offset such as shown by the portions on the left and right that extend upwards to support structures 410*a* and 410*b*. In various embodiments, the semiconductor region 402 includes an intrinsic semiconductor material such as germanium, a doped semiconductor, or other material as described herein. The waveguide integrated photodiode 400 includes a semiconductor region 402 on a substrate 404, with a doped semiconductor region 408 on top of the semiconductor region 402. The semiconductor region 402 is connected or in communication with metal contacts 406*a*, 406*b* or other conductive structure, through two elongated wing structures 410*a*, 410*b* of doped semiconductor region/component 408 such as for example, silicon wings, or a cap that extends in one or more directions above semiconductor region 402. Structures 410*a* and 410*b* are raised a longer distance above substrate 404 by the longer arms or extensions 408*a* and 408*b* of region 408. In some embodiments, the height of the vertical portions 408*a* and 408*b* can range from about 100 nm to about 1000 nm. In some embodiments, the height of the vertical portions 408*a* and 408*b* is less than about 500 nm.

In some embodiments, the two wing structures 410*a*, 410*b* have a top surface that is higher than the top surface of the doped semiconductor region 408, allowing for larger separation between the wing structures 410*a*, 410*b* and the substrate 404 without having to increase the thickness of the doped semiconductor region 408. In various embodiments the distance between the bottom surface of the two wing structures 410*a*, 410*b* and the top surface of the substrate 404 is between about 200 nm and about 1300 nm. In some embodiments, that distance is between about 400 nm and about 800 nm.

In some embodiments, the large separation between the wing structures 410*a*, 410*b* and the substrate region 404 reduces the parasitic capacitance of the waveguide integrated photodiode 400, therefore avoiding bandwidth degradation. Alternatively, in various embodiments, a very thick semiconductor region 408, for example, greater than about 400 nm, can allow for similar separation between the wing structures 410*a*, 410*b* and the substrate region 404, though this made degrade the optical responsivity of the waveguide integrated photodiode 400. In some embodiments, for improved responsivity, it is advantageous to have the thickness of the semiconductor region 408 less than about 250 nm. In many embodiments, an optical signal may be carried by a waveguide formed in the bottom substrate 404 such as in region 415 and/or in other portions of the substrate 404. Various recessed regions, steps, trenches and other structures may be also formed in FIG. 4 using the etchings of FIGS. 1B, and IC.

In various embodiments, additional metal contacts 406*c*, 406*d* are in electrical communication with the substrate 404. In various embodiments, the wing structures 410*a*, 410*b* are doped with a N+ dopant. In various embodiments, the doped semiconductor region 408 is doped with an increased concentration of N++ dopants on the wing structures 410*a*, 410*b*. In various embodiments, the waveguide integrated photodiode 400 includes an oxide layer 412. In many embodiments, the wing structures 410*a*, 410*b* and other similar structures disclosed herein are thing films.

Figures 5A, 5B, 5C, 5D, 5E, 5F:
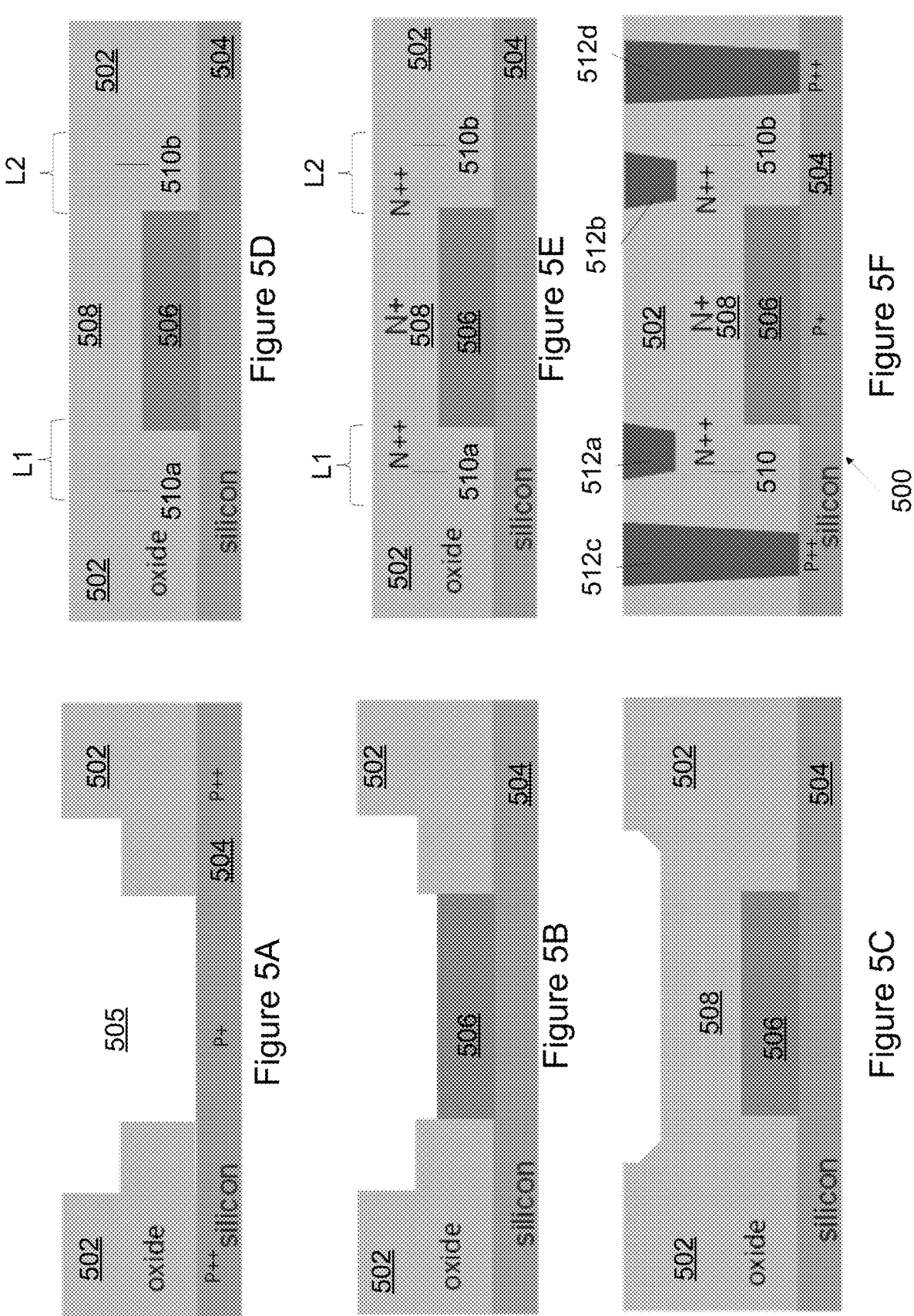
FIGS. 5A-5F depict an exemplary method of fabricating various photodiode designs incorporating wings or elongate structures according to an exemplary embodiment of the disclosure.

Refer now to example embodiment of FIGS. 5A-5F. FIGS. 5A-5F depict a sequence of cross-sections of a multi-layer semiconductor device corresponding to a photodiode assembly or portions thereof. The cross-sectional views shown in FIGS. 5A-5F shows different stages of an exemplary method of fabricating a waveguide integrated photodiode using various processing steps such as deposition, etching, and others. In FIG. 5A, an oxide layer or other insulation/passivation layer 502 is provided on a semiconductor substrate 504 to act as an insulation or passivation layer. In various embodiments, the silicon substrate 504 is doped silicon with a central P+ doped region and two P++ doped region on either side of the P+ doped region. In various embodiments, the silicon substrate 504 is more heavily doped in the edge regions of the silicon substrate than in the middle of the substrate such as shown in substrate 104 of FIG. 1. In many embodiments, the substrate 104, 204, 304, 404, 504 (and other substrates) may be semiconductor such as silicon. The substrate may be doped in various configurations and with various polarities suitable for directing current or establishing a voltage difference relative to the various metal contacts of the photodiode disclosed herein.

In some embodiments, the oxide layer 502 is shaped or etched to define layers or regions for other components of the photodiode assembly to be added during subsequent manufacturing steps. In various embodiments, a continuous layer of oxide layer 502 is deposited or formed and then it is etched or otherwise shaped to form the T-shaped trench region 505. In various embodiments, the trench region 505 may define steps in the passivation/insulator material 502. In FIG. 5B, a semiconductor region 506 such as a germanium is grown or deposited on the top surface of the silicon substrate 504 in the central trench region as shown.

In FIG. 5C, a semiconductor material 508 is deposited, formed, grown or otherwise positioned on top of the semiconductor region 506 and surfaces of the oxide (passivation or insulation) material 502. The semiconductor material 508 may be doped in various embodiments and may include silicon and other materials. In various embodiments, the semiconductor material 508 includes excess material as shown extending above the central trench and the left and right upper surfaces of the insulation/passivation material 502. In various embodiments, the height of the semiconductor region 506 may range from about 100 nm to about 500 nm. Similarly, the width of the semiconductor region 506 may range from about 200 nm to about 1000 nm.

In FIG. 5D, the excess material of the semiconductor material 508 shown in FIG. 5C has been removed through etching or another process. In various embodiments, the semiconductor structure 508 has a wing 510*a*, 510*b* on each side. The length of the extended sections is shown as L1 and L2. In some embodiments, one length of either L1 or L2 may be zero. L1 and L2 may be different lengths or substantially the same length. In some embodiments, the lengths L1 and L2 ranges from about 200 nm to about 1000 nm. In many embodiments, the elongate semiconductor structure's wings 510*a*, 510*b* do not significantly overlap with semiconductor region 506 and extend beyond its width. In various embodiments, the silicon region 508 may have only one silicon wing/elongate structure. The distance between the bottom surface of the wing region 510*a*, 510*b* and the top surface of the substrate region 504 may range from about 200 nm to about 800 nm. One familiar with the art of photodiode design would appreciate the importance of those dimensions as they affect many important characteristics of the photodiode, including responsivity, capacitance, series resistance, carrier transit time, and bandwidth.

In FIG. 5E, the elongate structures 510a, 510b, such as a wing or cap, has been formed from material 508 and additional doping such as by implantation has been performed. In some embodiments, the semiconductor material 508 is doped with N+ and/or N++ dopants. In various embodiments, the semiconductor material 508 is doped with N+ type dopants on a gradient such that the concentration of N-type dopants is greater on the silicon wings 510a, 510b, with a lower concentration of N+ type dopants closest to the semiconductor material 506. The region 508 could also have strong vertical gradient in dopant concentration that comes from in-situ doping and/or implantation. In various embodiments, the wings or extensions 510a, 510b may be supported by or disposed on or extend from one or more surfaces of the insulation/passivation layer 502. The foregoing and other distributions of dopants may be selected to avoid negatively affecting or otherwise degrading the optical properties of the germanium. In FIG. 5F, the metal contacts 512a, 512b, 512c, 512d are inserted, bonded, metalized, or otherwise formed. In various embodiments, metal contacts 512a, 512b are inserted to be in electrical communication with the silicon wings 510a, 510b of the semiconductor material structure/region 508. In various embodiments, the lengths of the semiconductor material 506 and the inner portion of material 508 before extending to L1 and L2 may range from about 5 µm to about 50 µm.

In various embodiments, metal contacts 512c, 512d are inserted, bonded, formed, and otherwise disposed to be in electrical contact with the substrate 504. In various embodiments, additional oxide layers are applied. The metal contacts 512c, 512d provide one or more electrical paths that support the operation of the photodiode. An example of a waveguide integrated photodiode 500 that includes a T-shaped elongate cap or wing or dual wing design 508 disposed above the region of semiconductor material 506 as shown in FIG. 5F. In various embodiments, the material 506 includes an intrinsic semiconductor material such as germanium, a doped semiconductor, or other material as disclosed herein. In addition, as shown in FIG. 5F, various electron and hole doping levels may be implemented in the materials being used as shown by the P+, P++, N+, and N++ doped materials shown.

Figures 6A, 6B, 6C, 6D, 6E, 6F:
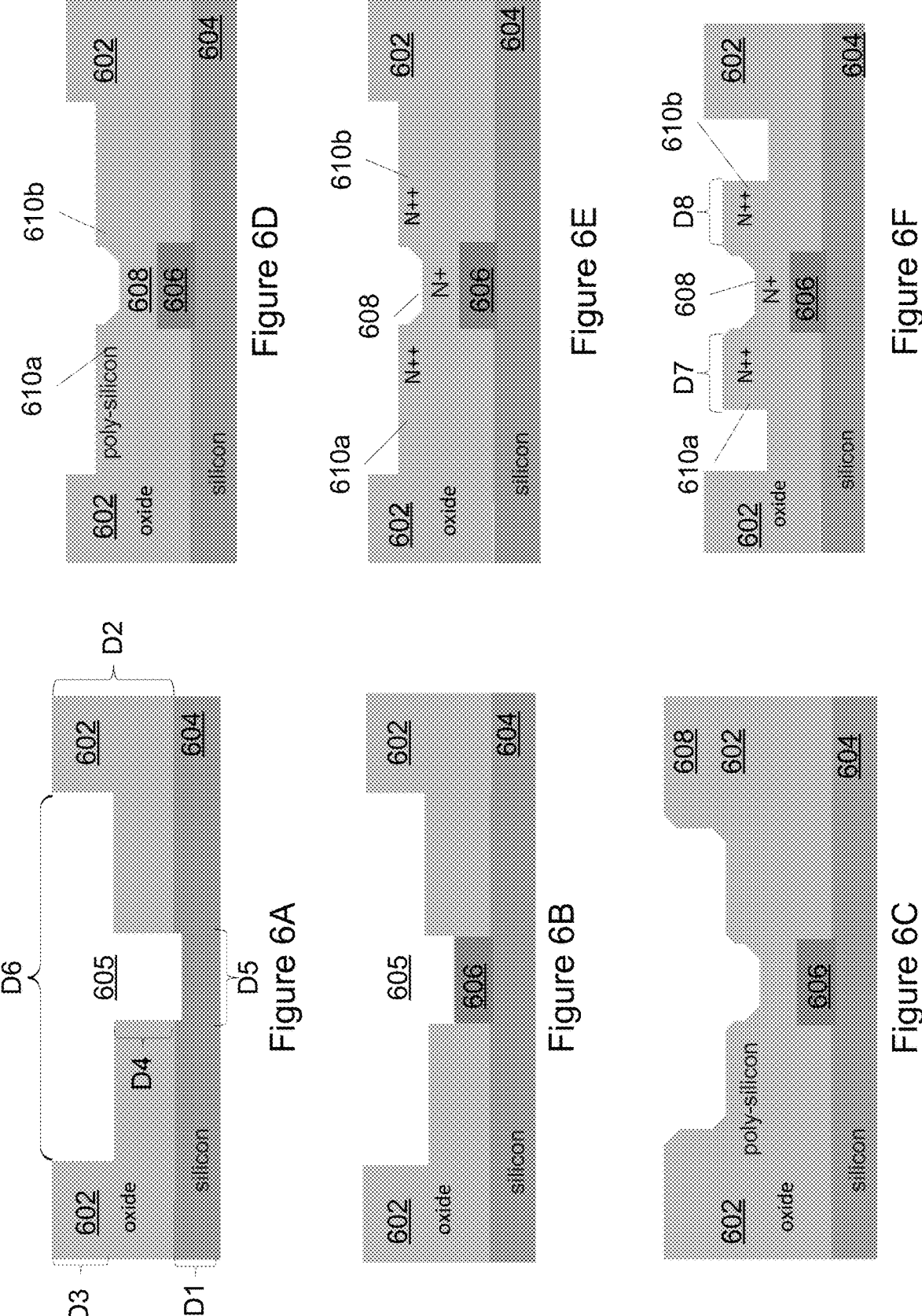
FIGS. 6A-6H depict an alternative method of fabricating various photodiode designs incorporating wings or elongate structures according to an exemplary embodiment of the disclosure.

Refer now to example embodiment of FIGS. 6A-6H. FIGS. 6A-6H depict a sequence of cross-sections of a multi-layer semiconductor device corresponding to a photodiode assembly or portions thereof. The cross-sectional views shown in FIGS. 6A-6H shows different stages of an exemplary method of fabricating a waveguide integrated photodiode using various processing steps such as deposition, etching, and others. In FIG. 6A, an oxide layer or other insulation/passivation layer 602 is provided on a semiconductor substrate 604 to act as an insulation or passivation layer.

In various embodiments, the silicon substrate 604 is doped silicon with a central P+ doped region and two P++ doped region on either side of the P+ doped region. In various embodiments, the silicon substrate 604 is more heavily doped in the edge regions of the silicon substrate than in the middle of the substrate such as shown in substrate 104 of FIG. 1. In many embodiments, the substrate 104, 204, 304, 404, 504, 604 (and other substrates) may be semiconductor such as silicon. The substrate may be doped in various configurations and with various polarities suitable for directing current or establishing a voltage difference relative to the various metal contacts of the photodiode disclosed herein. In various embodiments, the width of the substrate D1 is about 220 nm.

In some embodiments, the oxide layer 602 is shaped or etched to define layers or regions for other components of the photodiode assembly to be added during subsequent manufacturing steps. For example, oxide layer 602 shows two L-shaped steps separated in the middle by a distance D3. In various embodiments, the oxide layer 602 is defined in two steps. In various embodiments, a SiN layer is used as an etch stop. In various embodiments, a continuous oxide layer 602 is deposited or formed and then it is etched or otherwise shaped to form the T-shaped trench region 605. In various embodiments, the trench region 605 may define steps in the passivation/insulator material 602. In various embodiment the trench is defined such that D2 is about 800 nm, D3 is about 350 nm, D4 is about 450 nm, D5 is about 0.5 µm, and D6 is about 3 µm.

In FIG. 6B, a region of semiconductor material 606 such as a germanium is grown or deposited on the top surface of the silicon substrate 604 in the central trench region as shown. In various embodiments the height of semiconductor material 606 is about 250 nm. In FIG. 6C, a semiconductor material 608 is deposited, formed, grown or otherwise positioned on top of the semiconductor region 606 and surfaces of the oxide (passivation or insulation) material 602. The material 608 may have the stepped shape shown with straight or curved transitions and corners. In various embodiments, the semiconductor material 608 is poly-silicon. The semiconductor material 608 may be doped in various embodiments and may include silicon and other materials. In various embodiments, the semiconductor material 608 includes excess material as shown extending above the central trench and the left and right upper surfaces of the insulation/passivation material 602. In various embodiments height of the semiconductor material 608 is about 150 nm to about 250 nm.

In FIG. 6D, the excess material of the semiconductor material 608 shown in FIG. 6C has been removed through etching or another process. In various embodiments, the semiconductor material 608 has been structured, defined or patterns such that a wing 610a, 610b has been formed or defined on each side. In FIG. 6E, the elongate structures 610a, 610b, such as a wing or cap, have been formed from material 608 and additional doping such as by implantation has been performed. In some embodiments, the semiconductor material 608 is doped with N+ and/or N++ dopants. In various embodiments, the semiconductor material 608 is doped with N+ type dopants on a gradient such that the concentration of N-type dopants is greater on the silicon wings 610a, 610b, with a lower concentration of N+ type dopants closest to the semiconductor material 606. The semiconductor material 608 could also have strong vertical gradient in dopant concentration that comes from in-situ doping and/or implantation. In various embodiments, the wings 610a, 610b may be supported by or disposed on or extend from one or more surfaces of the insulation/passivation layer 602 and be positioned in previously formed trench region 605. The foregoing and other distributions of dopants may be selected to avoid negatively affecting or otherwise degrading the optical properties of the semiconductor region 606.

In FIG. 6F, the wings 610a, 610b are further shortened through etching or another process. The length of the extended sections is shown as being reduced to D7 and D8. In various embodiments D7 and D8 are about 0.65 µm. In some embodiments, one length of either D7 or D8 may be zero. D7 and D8 may be different lengths or substantially the same length. In many embodiments, the elongate semiconductor structure's wings 610a, 610b do not significantly overlap with semiconductor region 606 and extend beyond its width. In various embodiments, the silicon material 608 may have only one silicon wing/elongate structure. One familiar with the art of photodiode design will appreciate that the dimensions may be selected and defined, such as through simulation and test chips, because as they affect many important characteristics of the photodiode, including responsivity, capacitance, series resistance, carrier transit time, and bandwidth.

Figure 6G:
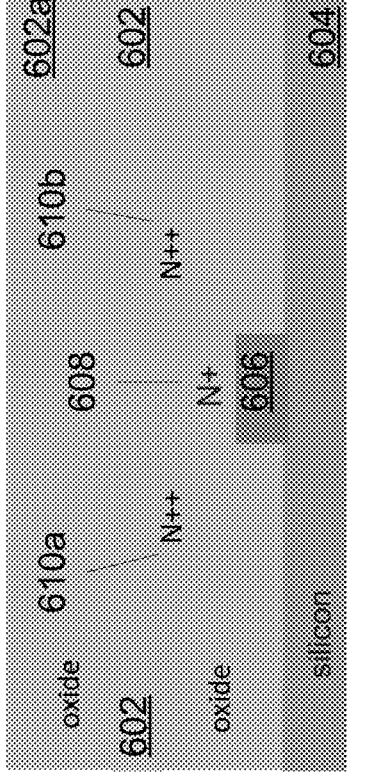
Figure 6H:
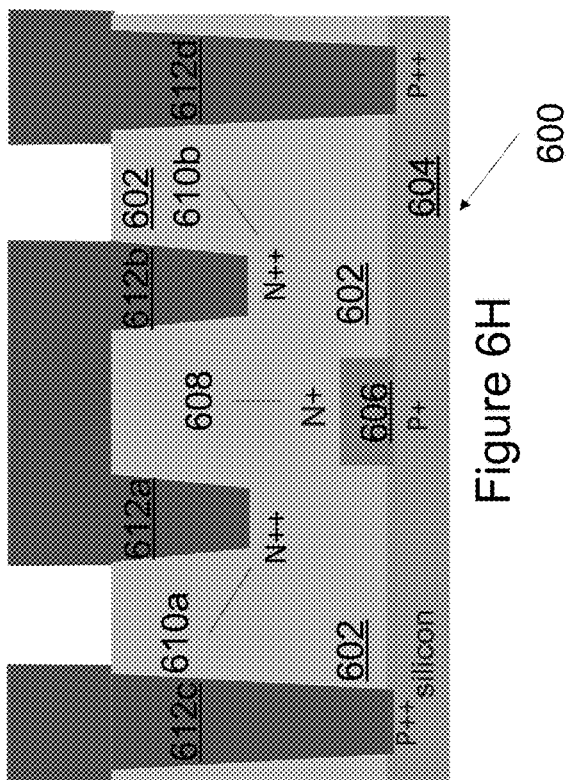

In FIG. 6G, additionally layers of oxide 602a are deposited or applied above the silicon material 608 and wings 610a, 610b and existing oxide layer 602. Layers 602 and 602a are typically the same oxide/passivation material. In FIG. 6H, metal contacts 612a, 612b, 612c, 612d are inserted, bonded, metalized, or otherwise formed. In various embodiments, metal contacts 612a, 612b are inserted, deposited, or otherwise formed to be in electrical communication with the silicon wings 610a, 610b of the semiconductor material structure/region 608.

In various embodiments, metal contacts 612c, 612d are inserted, bonded, formed, and otherwise disposed to be in optical contact with the substrate 604. In various embodiments, additional oxide layers are applied. The metal contacts 612c, 612d provide one or more electrical paths that support the operation of the photodiode. An example of a waveguide integrated photodiode 600 that includes a T-shaped elongate cap or wing or dual wing design 608 disposed above the region of semiconductor material 606 as shown in FIG. 6H.

It will be appreciate by one of skill in the art that the exemplary method of FIGS. 6A-6H produce a waveguide integrated photodiode 600 with a large separation between the wings 610a, 610b and the substrate 604. In various embodiments this separation is greater than about 450 nm. In some embodiments the separation between the interconnect of the wings 610a, 610b and the metal contacts 612a, 612b, and the substrate 604 is about 800 nm. In various embodiments, the material 606 includes an intrinsic semiconductor material such as germanium, a doped semiconductor, or other material as disclosed herein. In addition, as shown in FIG. 6H, various electron and hole doping levels may be implemented, defined, or formed in the materials being used as shown by the P+, P++, N+, and N++ doped materials shown.

Figure 7G:
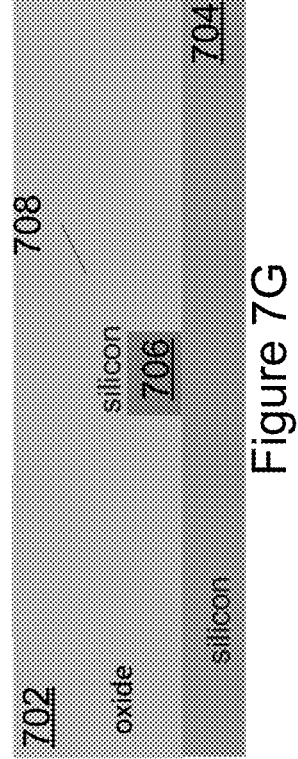

Refer now to example embodiment of FIGS. 7A-7H. FIGS. 7A-7H depict a sequence of cross-sections of a multi-layer semiconductor device corresponding to a photodiode assembly or portions thereof. The cross-sectional views in FIGS. 7A-7H show different stages of an exemplary method of fabricating a waveguide integrated photodiode using various processing steps such as deposition, etching, and others. In FIG. 7A, an oxide layer or other insulation/passivation layer 702 is provided on the top surface semiconductor substrate 704 to act as an insulation or passivation layer.

In various embodiments the oxide layer 702 is includes a central trench 705. In various embodiments, the silicon substrate 704 is doped silicon with a central P+ doped region and two P++ doped region on either side of the P+ doped region. In various embodiments, the silicon substrate 704 is more heavily doped in the edge regions of the silicon substrate than in the middle of the substrate such as shown in substrate 104 of FIG. 1. In many embodiments, the substrate 104, 204, 304, 404, 504, 604, 704 (and other substrates) may be a semiconductor such as silicon or a multi-layer substrate. The substrate may be doped in various configurations and with various polarities suitable for directing current or establishing a voltage difference relative to the various metal contacts of the photodiode disclosed herein.

In some embodiments, the oxide layer 702 is shaped or etched to define layers or regions for other components of the photodiode assembly to be added during subsequent manufacturing steps. In various embodiments the oxide layer 702 is defined in two steps. In various embodiments, a SiN layer is used as an etch stop. In various embodiments, a continuous oxide layer 702 is deposited or formed and then it is etched or otherwise shaped to form the central trench 705. In various embodiments the width of the central trench 705 is about 3 μm. In various embodiments, the central trench 705 may define steps in the passivation/insulator material 702.

In FIG. 7B, a semiconductor region 706 such as a germanium is grown or deposited on the top surface of the silicon substrate 704 in the central trench 705. After the semiconductor region 706 is deposited, a semiconductor material 708 is grown or deposited on the top surface of the semiconductor region 706 as shown. In various embodiments the semiconductor material 708 is poly-silicon. The semiconductor material 708 may be doped in various embodiments and may include silicon and other materials. In various embodiments height of the semiconductor material 608 is about 150 nm to about 250 nm.

In FIG. 7C, the semiconductor material 708 is implanted by dopants 709 as shown by the downward point arrows. In various embodiments the dopants 709 are silicon caps. In some embodiments, the semiconductor material 708 is doped with N+ and/or N++ dopants. In various embodiments, the implantation occurs such that the semiconductor material 708 is doped with N+ type dopants on a gradient where the concentration of N-type dopants is greater on the outside portions, with a lower concentration of N+ type dopants closest to the center of the semiconductor material 708. In various embodiments, the semiconductor material 708 could also have strong vertical gradient in dopant concentration that comes from in-situ doping and/or implantation. The foregoing and other distributions of dopants may be selected to avoid negatively affecting or otherwise degrading the optical properties of the semiconductor region 706.

In FIG. 7D, an additional insulation/passivation layer such as the oxide layer 702 is grown or deposited on the top surface of the semiconductor material 708.

In FIG. 7E, the oxide layer 702, semiconductor material 708, and semiconductor material 706 are etched to define two open regions, cavities, or trenches, 710a, 710b. In various embodiments, the central region of the oxide layer 702, semiconductor material 708, and semiconductor material 706 have a width of about 1.5 μm. In FIG. 7F, semiconductor material 706 is shortened through etching or another process such that the open regions 710a, 710b are thickest or expanded in width in the same layer of the semiconductor material 706. As shown, in some embodiments the width of region 706 is less than the width of regions 708 and 702.

Figure 7H:
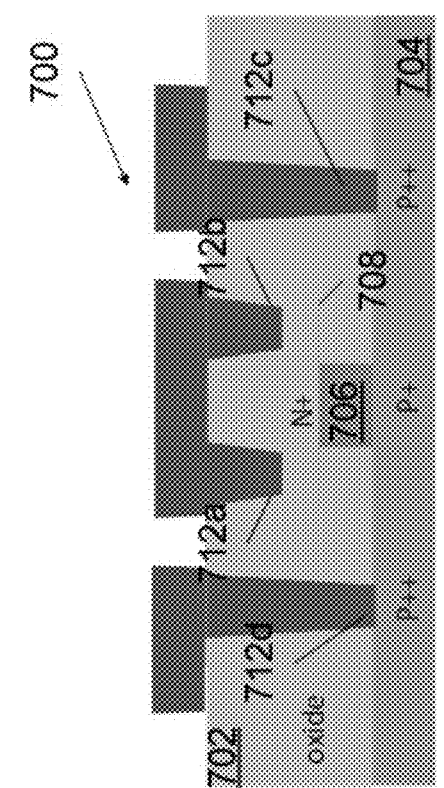

In FIG. 7G, additionally layers of oxide 702 are deposited or applied to fill the open regions 710a, 710b. In FIG. 7H, metal contacts 712a, 712b, 712c, 712d are inserted, bonded, metalized, or otherwise formed. In various embodiments, metal contacts 712a, 712b are inserted to be in electrical communication with the semiconductor material structure/region 708.

In various embodiments, metal contacts 712c, 712d are inserted, bonded, formed, and otherwise disposed to be in optical contact with the substrate 704. In various embodiments, additional oxide layers are applied. The metal contacts 712c, 712d provide one or more electrical paths that support the operation of the photodiode. An example of a waveguide integrated photodiode 700 that includes a T-shaped elongate cap or wing or dual wing structure 708 disposed above the region of semiconductor material 706 as shown in FIG. 7H. In various embodiments, the material 706 includes an intrinsic semiconductor material such as germanium, a doped semiconductor, or other material as disclosed herein. In addition, as shown in FIG. 7H, various electron and hole doping levels may be implemented in the materials being used as shown by the P+, P++, N+, and N++ doped materials shown.

The above description includes various fabrication steps such as growth of semiconductors, doping, etching etc. It is to be appreciated that standard semiconductor fabrication processes such as cleaning, pre-baking, selective and non-selective epitaxy, implantation, annealing, recrystallization, lithography, etching, etc. may be used for the fabrication of the devices and structures disclosed herein.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

In the claims, as well as in the specification above, all transitional phrases such as "comprising," "including," "carrying," "having," "containing," "involving," "holding," "composed of," and the like are to be understood to be open-ended, i.e., to mean including but not limited to. The transitional phrases "consisting of" and "consisting essentially of" shall be closed or semi-closed transitional phrases, respectively.

Where a range or list of values is provided, each intervening value between the upper and lower limits of that range or list of values is individually contemplated and is encompassed within the disclosure as if each value were specifically enumerated herein. In addition, smaller ranges between and including the upper and lower limits of a given range are contemplated and encompassed within the disclosure. The listing of exemplary values or ranges is not a disclaimer of other values or ranges between and including the upper and lower limits of a given range.

The use of headings and sections in the application is not meant to limit the disclosure; each section can apply to any aspect, embodiment, or feature of the disclosure. Only those claims which use the words "means for" are intended to be interpreted under 35 USC 112, sixth paragraph. Absent a recital of "means for" in the claims, such claims should not be construed under 35 USC 112. Limitations from the specification are not intended to be read into any claims, unless such limitations are expressly included in the claims.

Embodiments disclosed herein may be embodied as a system, method or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, embodiments may take the form of a computer program product embodied in one or more computer readable medium(s) having computer readable program code embodied thereon.

What is claimed is:

1. A photodiode comprising:

a substrate;

a semiconductor layer comprising a semiconductor material, the semiconductor layer disposed on the substrate and in communication with at least a region of the substrate, the semiconductor layer having a first side, a second side, and an uppermost surface, the semiconductor layer having height $H_j$;

a semiconductor structure partially disposed on the uppermost surface, the semiconductor structure comprising:

at least one elongate portion that extends beyond the first side and along a portion of the uppermost surface of the semiconductor layer, wherein the first side is the furthest that the semiconductor layer and the semiconductor material extend in a first direction that is parallel with the uppermost surface; and a metal contact that is in electrical connection with the elongate portion of the semiconductor structure.

2. The photodiode of claim 1, wherein a portion of the substrate is an optical waveguide and wherein a portion of the semiconductor material is in optical communication with a region of the optical waveguide.

3. The photodiode of claim 1, wherein the elongate portion extends beyond the first side, along the uppermost surface, and beyond the second side of the semiconductor layer.

4. The photodiode of claim 1, wherein the elongate portion is doped with N+ dopants.

5. The photodiode of claim 3, wherein the elongate portion is doped with N+ dopant such that the concentration of N+ dopants is greater at a first end and a second end of the elongate portion relative to a middle portion of the elongate portion.

6. The photodiode of claim 1 further comprising a plurality of electrical contacts, wherein one of the plurality of electrical contacts extends from the substrate and wherein another of the plurality of electrical contacts extends from the elongate portion.

7. The photodiode of claim 1, wherein the elongate portion comprises a first wing that extends past the first side.

8. The photodiode of claim 7, wherein the elongate portion comprises a second wing that extends past the second side.

9. The photodiode of claim 1, wherein the semiconductor material is selected from the group consisting of germanium, silicon, tin, indium, gallium, phosphorous, arsenic and their alloys.

10. The photodiode of claim 1, wherein $H_i$ is greater than about 200 nm and less than about 900 nm.

11. The photodiode of claim 1 further comprising an insulator layer, wherein the insulator layer defines a trench, wherein the semiconductor material is disposed in the trench.

12. The photodiode of claim 1, wherein the substrate comprises silicon, wherein the silicon is p-type doped.

13. The photodiode of claim 7, wherein a length of the first wing ranges from about 200 nm to about 1000 nm.

14. The photodiode of claim 1, wherein the semiconductor structure and the substrate are doped such the charge carrier properties of the semiconductor structure is opposite of the charge carrier properties of the silicon substrate.

15. The photodiode of claim 1, wherein the semiconductor structure further comprises a central portion having a top surface, wherein a top surface of the elongate portion is higher than the top surface of the central portion.

16. The photodiode of claim 1, wherein the distance from a top surface of the substrate and a top surface of the elongate portion of the semiconductor structure is greater than about 450 nm but less than about 800 nm.

17. The photodiode of claim 2, wherein semiconductor layer partially resides inside the substrate in a recessed cavity.

18. A photodiode comprising:
   a substrate;
   a semiconductor layer comprising a semiconductor material and disposed on the substrate, wherein a portion of the semiconductor layer is in communication with at least a region of the substrate, the semiconductor layer having a first side, a second side, and an uppermost surface; and
   a semiconductor structure partially disposed on the uppermost surface of the semiconductor layer, the semiconductor structure comprising:
      a first elongate portion that extends beyond the first side of the semiconductor layer and a second elongate portion that extends beyond the second side of the semiconductor layer, wherein the first side is the furthest that the semiconductor layer and the semiconductor material extend in a first direction, wherein the second side is the furthest that the semiconductor layer and the semiconductor material extend in a second direction opposite the first direction; and
   at least one metal contact that is in electrical connection with at least one of the first or second elongate portion of the semiconductor structure.

19. The photodiode of claim 18 further comprising a pair of insulator structures that define a stepped trench, wherein the semiconductor layer is disposed in a bottom of the stepped trench.

20. The photodiode of claim 18, wherein the distance from a top surface of the substrate and a top surface of the first and second elongate portions of the semiconductor structure is greater than about 450 nm but less than about 800 nm.

21. A method of manufacturing an integrated photodiode comprising:
   providing a silicon substrate with an oxide layer;
   growing a semiconductor layer comprising a semiconductor material on an exposed portion of the silicon substrate, the semiconductor layer comprising a first side, an uppermost surface, and a second side;
   forming a semiconductor structure on the uppermost surface of the semiconductor layer wherein the semiconductor structure has at least one elongate portion that extends beyond the first side of the semiconductor layer, wherein the first side is the furthest that the semiconductor layer and the semiconductor material extend in a first direction that is parallel with the uppermost surface; and
   bonding a metal contact onto the elongate portion of the semiconductor structure.

22. The method of claim 21 further comprising:
   etching excess portions of the semiconductor structure.

23. The method of claim 21 further comprising:
   doping the semiconductor structure.

24. The method of claim 23, wherein the semiconductor structure is doped such that a portion of the semiconductor structure bonded to the uppermost surface of the semiconductor layer is less doped relative to the at least one doped portion.

25. The method of claim 21 further comprising shortening a portion of the elongate portion of the semiconductor structure.

26. The method of claim 21, wherein the trench is T-shaped having a base opening of about 0.5 μm and a top opening of about 3 μm.

27. The method of claim 21 further comprising:
   removing a portion of an oxide layer to leave an exposed portion of the silicon substrate and defining a trench relative thereto.

* * * * *